(12) United States Patent
Ahn

(10) Patent No.: US 10,413,939 B2
(45) Date of Patent: Sep. 17, 2019

(54) ELECTRONIC VIBRATOR

(71) Applicant: FASCOENG., LTD, Gunpo-si (KR)

(72) Inventor: Dong Jun Ahn, Boryeong-si (KR)

( * ) Notice: Subject to any disclaimer, the term of this patent is extended or adjusted under 35 U.S.C. 154(b) by 274 days.

(21) Appl. No.: 15/523,030

(22) PCT Filed: Oct. 13, 2015

(86) PCT No.: PCT/KR2015/010795
§ 371 (c)(1),
(2) Date: Apr. 28, 2017

(87) PCT Pub. No.: WO2016/068520
PCT Pub. Date: May 6, 2016

(65) Prior Publication Data
US 2017/0312783 A1  Nov. 2, 2017

(30) Foreign Application Priority Data
Oct. 29, 2014 (KR) .................. 10-2014-0149518

(51) Int. Cl.
| | |
|---|---|
| *H02K 33/16* | (2006.01) |
| *B06B 1/04* | (2006.01) |
| *H03K 17/08* | (2006.01) |
| *H03K 17/567* | (2006.01) |
| *B06B 1/02* | (2006.01) |
| *B02C 19/16* | (2006.01) |

(52) U.S. Cl.
CPC ............ *B06B 1/045* (2013.01); *B06B 1/0215* (2013.01); *H02K 33/16* (2013.01); *H03K 17/08* (2013.01); *H03K 17/567* (2013.01); *B02C 19/16* (2013.01)

(58) Field of Classification Search
CPC ...... H02K 33/16; H03K 17/567; H03K 17/08; B65D 88/66; B06B 3/02; B06B 1/04; B06B 1/0215; B06B 1/045; B65G 65/30; F16C 32/0461; F16C 32/0468; F16C 32/047
USPC ..... 310/216.021, 216.022, 216.023, 216.024
See application file for complete search history.

(56) References Cited

U.S. PATENT DOCUMENTS

| | | | | |
|---|---|---|---|---|
| 2002/0031239 | A1* | 3/2002 | Kobayashi ............... | B06B 1/04 381/412 |
| 2004/0207503 | A1* | 10/2004 | Flanders .................. | H01F 3/14 336/223 |
| 2015/0349772 | A1* | 12/2015 | Schubert .......... | H03K 17/04123 327/427 |

FOREIGN PATENT DOCUMENTS

| | | |
|---|---|---|
| JP | 05-091746 A | 4/1993 |
| JP | 2005-238235 A | 9/2005 |
| KR | 10-2004-0089162 A | 10/2004 |

(Continued)

OTHER PUBLICATIONS

English translation of 10-1203927.
(Continued)

*Primary Examiner* — Julio C. Gonzalez
*Assistant Examiner* — Leda T Pham
(74) *Attorney, Agent, or Firm* — Antonio Ha & U.S. Patent, LLC

(57) ABSTRACT

An electronic vibrator comprises a power source unit converting AC power into DC power, a bridge circuit comprising an insulated-gate bipolar transistor (IGBT) as a power switching device for driving a large-capacity oscillator, a circuit driving unit driving the bridge circuit and applying a sine wave which is a sine wave PWM modulation reference wave as well as a triangular wave, and a vibration generator connected to the bridge circuit, generating vibration by a current supplied by the bridge circuit.

4 Claims, 7 Drawing Sheets

(56) References Cited

FOREIGN PATENT DOCUMENTS

KR  10-1203927 B1  11/2012
KR  10-2014-0064559 A  5/2014

OTHER PUBLICATIONS

English translation of 2005-238235.
English translation of 05-091746.
English translation of 10-2004-0089162.
English translation of 10-2014-0064559.

\* cited by examiner

ELECTRONIC VIBRATOR

CROSS-REFERENCE TO RELATED APPLICATIONS

This patent application is a national-stage application of International Patent Application No. PCT/KR2015/010795 filed on Oct. 13, 2015, which claims priority under 35 U.S.C. § 119 to Korean Patent Application No. 10-2014-0149518, filed on Oct. 29, 2014, in the Korean Intellectual Property Office, the disclosure of which is incorporated by reference herein in its entirety.

TECHNICAL FIELD

The present invention relates to an electronic vibrator, and more specifically to, an electronic vibrator pulverizing and scattering powders transferred inside a chute, a hopper, or a transferring pipe facility to prevent a sloping discharge opening from being narrowed or clogged due to adsorption or agglomeration of powders inside the discharge opening, increasing and maintaining liquidity of a manufacturing facility so that the powders can be efficiently transferred and supplied from the facility to transferring lines, preventing the sloping discharge opening of the facility from being narrowed or clogged due to adsorption or agglomeration of the powders inside the sloping discharge opening, comparatively easily applying the electronic vibrator to an existing facility to be installed and used, for preventing an excessive flow of electric current due to an increased conduction time of a power device in an ultra-low frequency operation range, preventing a fracture of the power device due to the excessive flow of electric current, and capable of guaranteeing a stable operation without increasing the current even in the ultra-low frequency operation interval.

DISCUSSION OF RELATED ART

Materials such as powder are typically transferred through transferring pipes and discharge ports of the transferring facilities in construction of various kinds of chutes, hoppers, or transferring pipe facilities for storing and supplying powders or particulate matter used in transportation systems of petrochemical plants.

However, there are many issues on conventional facilities continuously inputting and storing various kinds of powdery materials in a large amount and supplying them through the transferring facilities. For examples, the powders to be put into such facilities are aggregated with each other due to their own physical properties such as moisture or static electricity, deteriorating the fluidity. Further, the aggregated powders congregate around an inclined outlet of a lower portion of the facility to cause the inclined outlet to be narrowed or clogged in severe conditions, thereby the powdery matter cannot easily be discharged to disrupt their supply.

While the powders are put into and stored in the facility for a long time, the powders located near the lower portion of the outlet may receive a substantial pressure, and the discharge rate at a central portion of the facility is differentiated from that at a side portion of the facility. Thus, a shear pressure is applied from the central portion to the side portion, and thus the powders are pressurized toward the outlet to be stuck and attached to the outlet.

If such phenomenon continues for a long time, the thickness of the adsorbent layer of the powders gradually increases to narrow the passage of the discharge opening. Further, the discharge opening becomes clogged so that the powders cannot be discharged and transferred. An economic burden follows because it is required to periodically perform internal maintenance and cleaning of the facility such as frequently checking them, removing powdery adsorbent layers at a lot of manpower and costs.

In order to address such issues, various vibration generators, e.g., an electronic hammer, have been proposed. However, their structures are not suitable for a long-time use and are complicated to frequently cause malfunctions.

Conventional vibration generators use a pulse width modulated (PWM) inverter scheme to increase the driving efficiency. Their operations are stable in an operating frequency range of 40 Hz or more.

Korean Patent No. 10-1203927 can be referred as a representative example of such techniques.

However, the conventional methods have issues; for example, electric current is excessively increased due to an increased conduction time of the power devices in a very low frequency operating range of 40 Hz or less, and thus, the power devices are frequently broken despite current protection and restriction measures.

SUMMARY

The present invention has been proposed to address issues as described above. The present invention is purposed to provide an electronic vibrator pulverizing and scattering powders transferred inside a chute, a hopper, or a transferring pipe facility to prevent a sloping discharge opening from being narrowed or clogged due to adsorption or agglomeration of powders inside the discharge opening, increasing and maintaining liquidity of a manufacturing facility so that the powders can be efficiently transferred and supplied from the facility to transferring lines, preventing the sloping discharge opening of the facility from being narrowed or clogged due to adsorption or agglomeration of the powders inside the sloping discharge opening, allowing for relatively easy application, installation, and use of the electronic vibrator in an existing facility, for preventing an excessive flow of electric current due to an increased conduction time of a power device in an ultra-low frequency operation range, preventing a fracture of the power device due to the excessive flow of electric current, and guaranteeing a stable operation without increasing the current even in the ultra-low frequency operation interval.

In order to achieve the objects as described above, an electronic vibrator according to the present invention, comprises a bridge circuit comprising an insulated-gate bipolar transistor (IGBT) as a power switching device for driving a large-capacity oscillator, a circuit driving unit driving the bridge circuit and applying a sine wave which is a sine wave PWM modulation reference wave as well as a triangular wave, and a vibration generator connected to the bridge circuit, generating vibration by current supplied by the bridge circuit. The bridge circuit comprises a first transistor; a first diode connected in parallel with the first transistor, a second transistor connected in series with the first transistor, a second diode connected in parallel with the second transistor, a third transistor connected in parallel with the first transistor, a third diode connected in parallel with the third transistor, a fourth transistor connected in series with the third transistor, a fourth diode connected in parallel with the fourth transistor, a resistor connected as a start point between the first transistor and the second transistor and as an end point between the third transistor and the fourth transistor, the power source unit 500 applying power to the first transistor and the second transistor, and a ground unit connected to the power source unit 500 and the second transistor, and the fourth transistor.

According to the electronic vibrator of the present invention, the triangular wave is applied to the circuit driving unit using an operational amplifier (OP Amp).

According to an electronic vibrator of the present invention, there are effects of pulverizing and scattering powders transferred inside a chute, a hopper, or a transferring pipe facility to prevent a sloping discharge opening from being narrowed or clogged due to adsorption or agglomeration of powders inside the discharge opening, increasing and maintaining liquidity of a manufacturing facility so that the powders can be efficiently transferred and supplied from the facility to transferring lines, preventing the sloping discharge opening of the facility from being narrowed or clogged due to adsorption or agglomeration of the powders inside the sloping discharge opening, comparatively easily applying the electronic vibrator to an existing facility to be installed and used, for preventing an excessive flow of electric current due to an increased conduction time of a power device in an ultra-low frequency operation range, preventing a fracture of the power device due to the excessive flow of electric current, and capable of guaranteeing a stable operation without increasing the current even in the ultra-low frequency operation interval.

The present invention will be described with reference to the embodiments shown in the accompanying drawings, but these are only exemplary. It will be understood by those skilled in the art that various changes and modifications may be made without departing from the scope of the present invention. Therefore, the true scope of protection of the present invention should be determined only by the appended claims.

DETAILED DESCRIPTION OF EXEMPLARY EMBODIMENTS

Hereinafter, an electronic vibrator according to an embodiment of the present invention will be described in detail with reference to the accompanying drawings.

Figure 1:
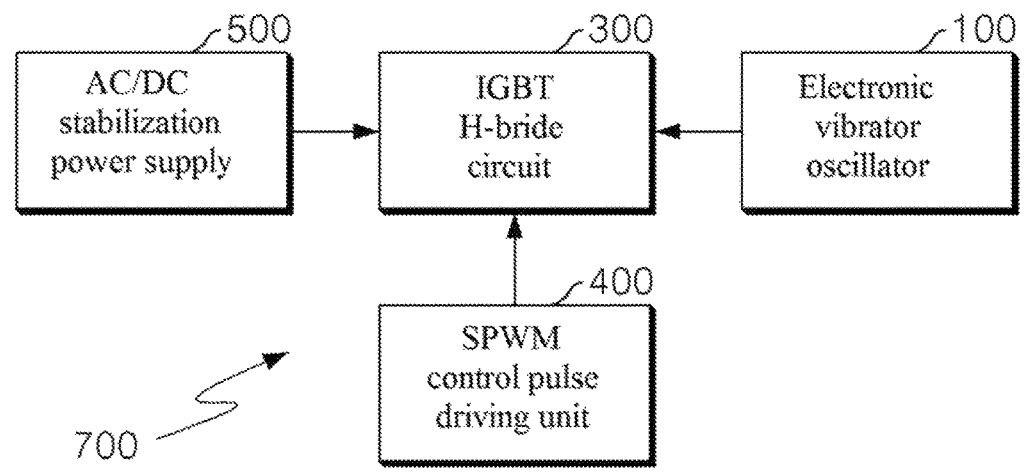
FIG. 1 is a block diagram illustrating a configuration of an electronic vibrator according to an embodiment of the present invention.
Figure 2:
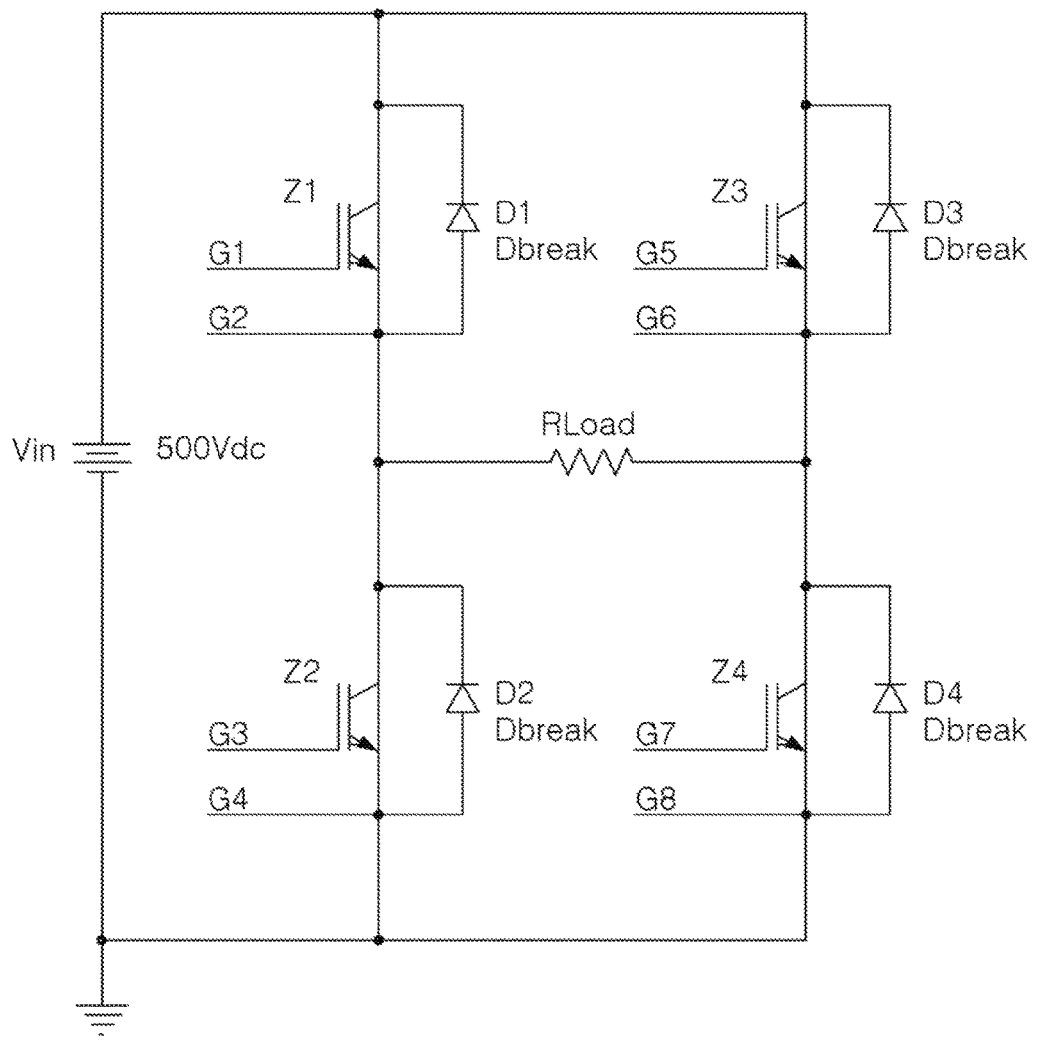
FIG. 2 is a bridge circuit diagram illustrating a driving circuit of the oscillator shown in FIG. 1.
Figure 3:
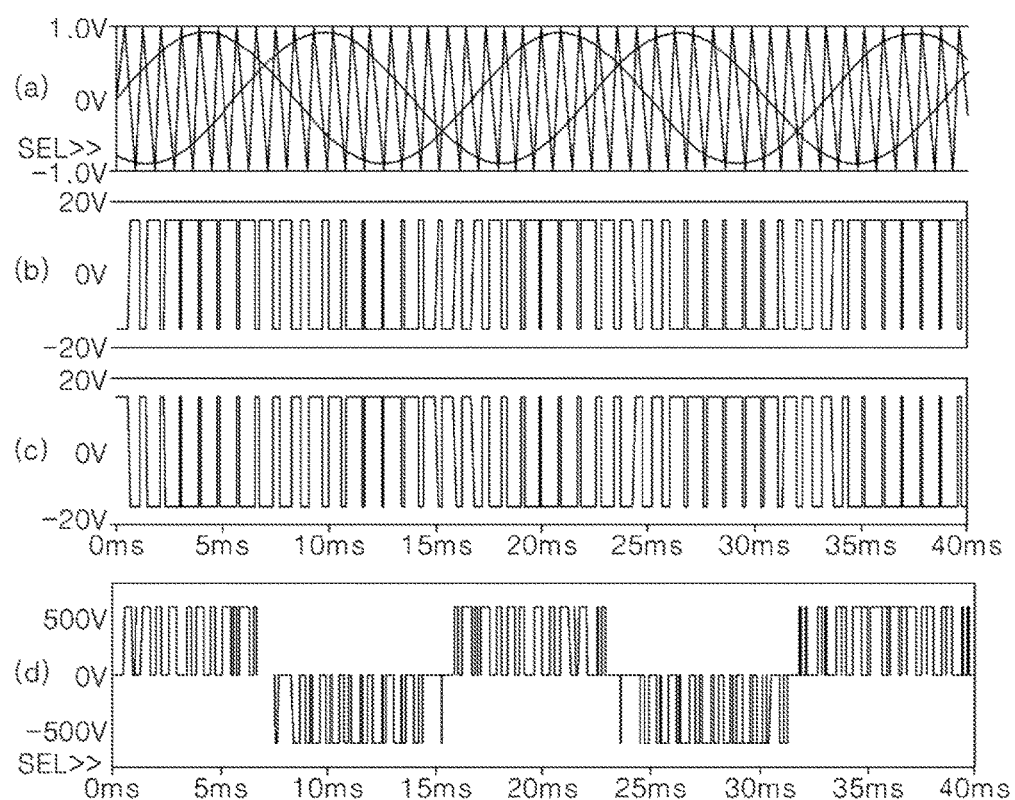
FIG. 3 is a view illustrating waveforms applied to the driving circuit of the electronic vibrator shown in FIG. 1.
Figure 4:
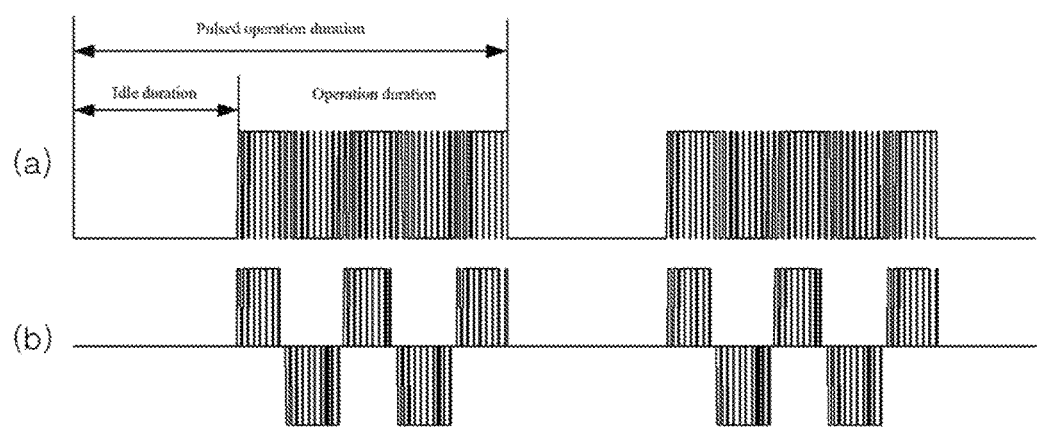
FIG. 4 is a conceptual view illustrating pulsating operations to which the intermittent operation concept is applied in the electronic vibrator shown in FIG. 1.
Figure 5:
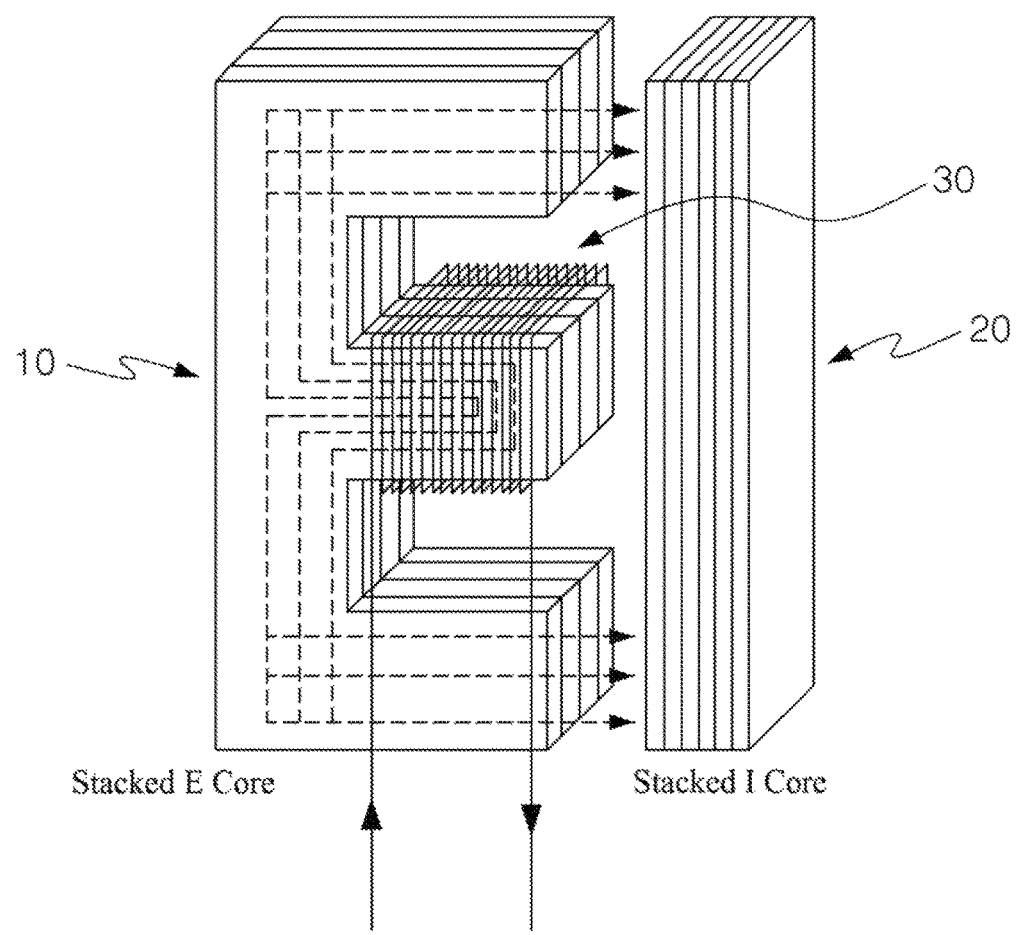
FIG. 5 is a view illustrating an internal configuration of a vibration generator according to an embodiment of the present invention.
Figure 6:
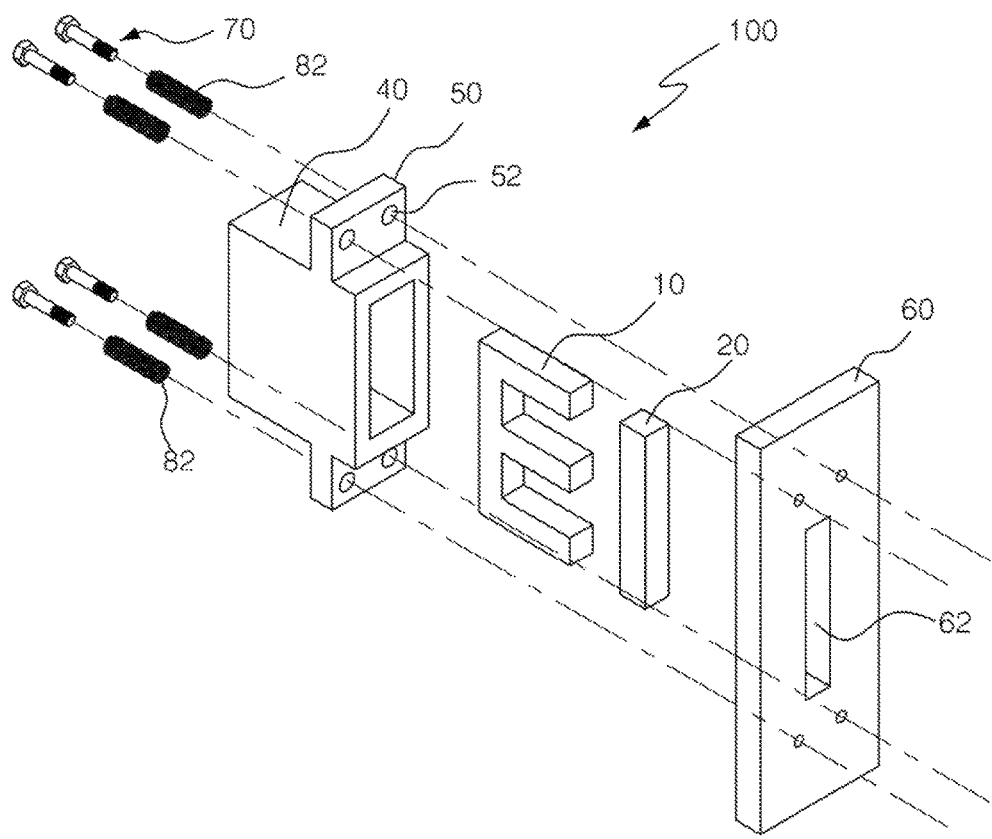
FIG. 6 is an exploded perspective view illustrating the vibration generator shown in FIG. 5.
Figure 7:
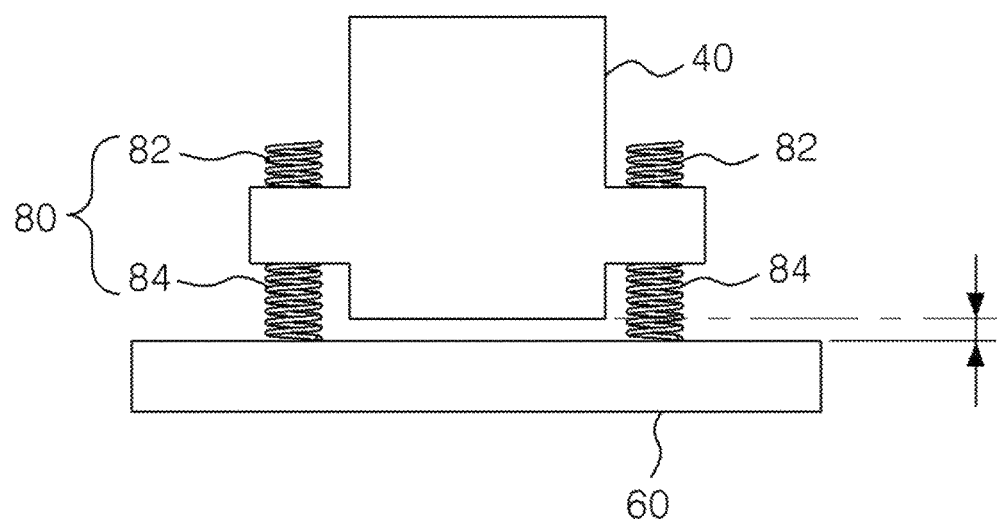
FIG. 7 is a front view illustrating the vibration generator shown in FIG. 5.

FIGS. 1 to 7 illustrate the electronic vibrator according to an embodiment of the present invention. FIG. 1 is a block diagram illustrating a configuration of an electronic vibrator according to an embodiment of the present invention, FIG. 2 is a view illustrating a bridge circuit diagram of driving circuit of the oscillator shown in FIG. 1, FIG. 3 is a view illustrating waveforms applied to the driving circuit of the electronic vibrator shown in FIG. 1, FIG. 4 is a conceptual view illustrating pulsating operations to which the intermittent operation concept is applied in the electronic vibrator shown in FIG. 1, FIG. 5 is a view illustrating an internal configuration of a vibration generator according to an embodiment of the present invention, FIG. 6 is an exploded perspective view illustrating the vibration generator shown in FIG. 5, and FIG. 7 is a front view illustrating the vibration generator shown in FIG. 5.

As illustrated in FIGS. 1 to 7 as described above, the electronic vibrator 700 according to an embodiment of the present invention, comprises a power source unit 500, a bridge circuit 300, a circuit driving unit 400, and a vibration generator 100.

The power source unit 500 converts AC power into DC power. The power source unit 500 comprises a bridge diode and a smoothing capacitor.

The detailed description is excluded because the configuration of the power source unit 500 is conventional.

The bridge circuit 300 comprises an insulated-gate bipolar transistor (IGBT) as a power switching device in order to enable the drive of a large-capacity oscillator.

The bridge circuit 300 comprises a first transistor Z1, a first diode D1 connected in parallel with the first transistor Z1, a second transistor Z2 connected in series with the first transistor Z1, a second diode D2 connected in parallel with the second transistor Z2, a third transistor Z3 connected in parallel with the first transistor Z1, a third diode D3 connected in parallel with the third transistor Z3, a fourth transistor Z4 connected in series with the third transistor Z3, a fourth diode D4 connected in parallel with the fourth transistor Z4, a resistor RLoad connected as a start point between the first transistor Z1 and the second transistor Z2 and as an end point between the third transistor Z3 and the fourth transistor Z4, the power source unit Vin applying power to the first transistor Z1 and the second transistor Z2, and a ground unit 0 connected to the power source unit 500 and the second transistor Z2 and the fourth transistor Z4.

The diode serves to prevent reverse noise in the bridge circuit 300.

The circuit driving unit 400 drives the bridge circuit 300. A method is adopted to apply a sine wave which is a sine wave PWM modulation reference wave as well as a triangular wave.

The triangular wave applied in the circuit driving unit 300 may be a triangular wave applied using an OP amplifier or a triangular wave applied using a program.

The vibration generator 100 comprises an E core 10, an I core 20, a winding unit 30, a housing 40, a wing plate 50, a bottom plate 60, a bolt 70, and a urethane spring 80.

As illustrated in FIG. 5, the E core 10 has an E-shape, is made of a steel plate, and comprises stacked layers.

The I core 20 is positioned to be spaced apart from the E core 10, is made of a steel plate, comprises stacked layers, and have an I-shape.

The winding unit 30 is wound around a portion horizontally protruding from the center of the E core 10. AC current is applied to the winding unit 30.

In a more specific description, the current supplied from the bridge circuit 300 is provided to the winding unit 30.

The housing 40 contains the E core 10, the I core 20, and the winding unit 30.

The wing plate 50 protrudes from a side wall of the housing 40 and comprises a wing through-hole 52 which is a bored hole.

As illustrated in FIGS. 6 and 7, the bottom plate 60 is positioned to be spaced apart from the housing 40 and has a containing groove 62 to contain the I core 20.

The bolt 70 penetrates the wing through-hole 50 to couple with the bottom plate 60.

The urethane spring 80 is coupled with the housing 40 to adjust an impact and buffering. The urethane spring is made of urethane.

In the present embodiment, the urethane spring 80 comprise an upper spring 82 and a lower spring 84.

The upper spring 82 is positioned between a head of the bolt 70 and an upper surface of the wing plate 50.

The lower spring 82 is positioned between a lower surface of the wing plate 50 and the bottom plate 60.

The E core 10 is preferably made of a silicon steel plate to generate a strong electromagnetic force.

According to the embodiment of the present invention, the electromagnetic vibrator 200 having the configuration as described above is used as follows.

The waveforms applied to the circuit driving unit 300 are as follows.

The waveforms of two sine waves which are modulation reference waves shown in FIG. 3a, are compared with the waveforms of the triangular wave which has a carrier waveform. When the sine wave is larger, a modulated waveform having a (+) polarity is generated. When the triangular wave is larger, a modulated waveform having a (−) polarity is generated. The PWM modulated waveform of the preceding sine wave and the triangular wave is as shown in FIG. 3 (b), and the PWM modulated waveform of the back sine wave and the triangular wave is as shown in FIG. 3(c).

The advantage of such scheme is to address the issue of current increase due to the increased conduction time of the power device in a very low frequency operation region of 40 Hz or less.

As illustrated in FIGS. 3 (b) and 3 (c), although the frequency of the sine wave is low, the frequency of the triangular wave which is a carrier wave is very high. Thus, the conduction time of the power device cannot be increased.

When the current is applied to the bridge circuit 300 of FIG. 2 based on the waveform of FIG. 3(b), a stable operation can be ensured in which the current does not abnormally increase even in the very low frequency region as shown in FIG. 3(d).

The operation method shown in FIG. 3 enables a smooth load operation. However, there are some shortcomings in order to secure a required amount of impact by the vibration generator.

Such issue can be addressed by applying an intermittent operation concept as shown in FIG. 4.

The operation waveform of FIG. 3(c) is changed to have an idle period and an operation period as illustrated in FIG. 4(a) to apply energy to the vibration generator 100 so that a required amount of impact may be obtained.

In other words, the current having the waveform as described above is applied to the winding unit 30.

Thus, a magnetic flux is generated as per Fleming's right-hand rule. The magnetic flux is circulated in the E core 10 and the I core 20.

When the applying direction of the current is alternated in order to prevent the magnetic saturation phenomenon, the rotational direction of the magnetic flux is the same as the applying direction of the current. Each attractive force of the E core 10 and the I core 20 are alternately generated with each other based on the alternate directions.

Since the alternate-generated attractive force interworks with the urethane spring 80 having an elastic modulus, the vibration is generated based on the alternate attractive force.

Due to alternate-generated attractive force (pulling force), the housing 40 is vibrated to repeatedly move toward and away from the bottom plate member 60.

Such vibration is amplified or relaxed by the upper spring 82 and the lower spring 84 to generate a constant vibration.

In the present embodiment, the E core 10 is made of a silicon steel plate to generate strong electromagnetic force.

The I core 20 having an alphabet I shape is used to prevent electromagnetic induction phenomenon (eddy current phenomenon) caused by such strong electromagnetic force.

What is claimed is:

1. An electronic vibrator comprising:
a power source unit (500) converting AC power into DC power;
a bridge circuit (300) comprising an insulated-gate bipolar transistor (IGBT) as a power switching device for driving a large-capacity oscillator;
a circuit driving unit (400) driving the bridge circuit (300) and applying a sine wave which is a sine wave PWM modulation reference wave as well as a triangular wave; and
a vibration generator (100) connected to the bridge circuit, generating vibration by a current supplied by the bridge circuit,
wherein the bridge circuit (300) comprises: a first transistor; a first diode connected in parallel with the first transistor; a second transistor connected in series with the first transistor; a second diode connected in parallel with the second transistor; a third transistor connected in parallel with the first transistor; a third diode connected in parallel with the third transistor; a fourth transistor connected in series with the third transistor; a fourth diode connected in parallel with the fourth transistor; a resistor connected as a start point between the first transistor and the second transistor and as an end point between the third transistor and the fourth transistor; the power source unit (500) applying power to the first transistor and the second transistor; and a ground unit connected to the power source unit (500) and the second transistor and the fourth transistor, and
wherein the vibration generator (100) comprises: an E core (10) having an E-shape, being made of a steel plate, and comprising stacked layers; an I core (20) positioned to be spaced apart from the E core (10), being made of a steel plate, comprising stacked layers, and having an I-shape; a winding unit (30) wound around a portion horizontally protruding from the center of the E core (10) and to which AC current is applied; a housing (40) containing the E core (10), the I core (20); and the winding unit (30); a wing plate (50) protruding from a side wall of the housing (40) and comprising a wing through-hole (52) which is a bored hole; a bottom plate (60) positioned to be spaced apart from the housing (40) and having a containing groove (62) to contain the I core (20); a bolt (70) penetrating the wing through-hole (50) to couple with the bottom plate (60); and a urethane spring (80) coupled with the housing (40) to adjust an impact and buffering and being made of urethane.

2. The electronic vibrator of claim 1, wherein the urethane spring (80) comprises an upper spring (82) positioned between a head of the bolt (70) and an upper surface of the wing plate (50) and a lower spring (82) positioned between a lower surface of the wing plate (50) and the bottom plate (60).

3. The electronic vibrator of claim 1, wherein the E core (10) is made of a silicon steel plate to generate a strong electromagnetic force.

4. The electronic vibrator of claim 1, wherein the triangular wave is applied to the circuit driving unit (400) using an operational amplifier (OP Amp).

* * * * *